US008068113B2

(12) United States Patent
Iizuka et al.

(10) Patent No.: US 8,068,113 B2
(45) Date of Patent: Nov. 29, 2011

(54) DISPLAY CONTROL SEMICONDUCTOR INTEGRATED CIRCUIT

(75) Inventors: Masaru Iizuka, Tokyo (JP); Iori Shiraishi, Tokyo (JP); Sosuke Tsuji, Tokyo (JP); Hiroto Kinno, Tokyo (JP)

(73) Assignee: Renesas Electronic Corporation, Kawasaki-shi (JP)

( * ) Notice: Subject to any disclaimer, the term of this patent is extended or adjusted under 35 U.S.C. 154(b) by 1361 days.

(21) Appl. No.: 11/650,417

(22) Filed: Jan. 8, 2007

(65) Prior Publication Data

US 2007/0205974 A1 Sep. 6, 2007

(30) Foreign Application Priority Data

Mar. 3, 2006 (JP) ................................ 2006-057105

(51) Int. Cl.

| | |
|---|---|
| ***G09G 5/39*** | (2006.01) |
| ***G11C 7/00*** | (2006.01) |
| ***G11C 29/00*** | (2006.01) |

(52) U.S. Cl. ....................................... 345/531; 365/200

(58) Field of Classification Search .................. 365/200; 345/530, 531
See application file for complete search history.

(56) References Cited

U.S. PATENT DOCUMENTS

| | | | | |
|---|---|---|---|---|
| 6,414,885 | B2 * | 7/2002 | Nagamatsu et al. | 365/200 |
| 7,184,356 | B2 * | 2/2007 | Noguchi et al. | 365/230.03 |
| 2002/0036932 | A1 * | 3/2002 | Lee et al. | 365/200 |
| 2004/0150653 | A1 * | 8/2004 | Sakamaki et al. | 345/592 |
| 2006/0083087 | A1 * | 4/2006 | Cowles et al. | 365/200 |
| 2006/0193184 | A1 | 8/2006 | Poechmueller | |

FOREIGN PATENT DOCUMENTS

| | | | |
|---|---|---|---|
| JP | 2000-347646 | A | 12/2000 |
| WO | WO 2005/015569 | A2 | 2/2005 |

* cited by examiner

*Primary Examiner* — Kee M Tung
*Assistant Examiner* — Jacinta M Crawford
(74) *Attorney, Agent, or Firm* — Miles & Stockbridge P.C.

(57) ABSTRACT

The present invention provides a display control semiconductor integrated circuit having therein a RAM, capable of repairing a defective bit included in the RAM and improving the yield without significantly increasing the occupation area. A liquid crystal controller/driver in which a RAM for storing display data is provided in a chip and the storage capacity of the built-in RAM is determined according to the size of a display screen of a liquid crystal panel to be driven, includes a fuse circuit for setting a defect address, and a comparing circuit for comparing the defect address set in the fuse circuit with an input address. The liquid crystal controller/driver also has a redundant circuit, when the addresses match each other, for replacing the input address with an address that instructs the spare memory area and supplying the address to an address decoder.

8 Claims, 8 Drawing Sheets

FIG. 4

| | WORD SELECT ADDRESS | | | | | | | | | | ROLE | REPAIR INFORMATION IN THE CASE OF REPAIRING WORD | | REPAIR INFORMATION IN THE CASE OF NO REPAIR | |
|---|---|---|---|---|---|---|---|---|---|---|---|---|---|---|---|
| | WORD SELECT ADDRESS IN HEXADECIMAL NOTATION | AD8 | AD7 | AD6 | AD5 | AD4 | AD3 | AD2 | AD1 | AD0 | | REPAIR ADDRESS | ENABLE SIGNAL | REPAIR ADDRESS | ENABLE SIGNAL |
| USE ADDRESS SPACE | 9' h000 | 0 | 0 | 0 | 0 | 0 | 0 | 0 | 0 | 0 | NORMAL WORD | 8' b00000000 | 1 | 8' bXXXXXXXX | 0 |
| | 9' h001 | | | | | | | | | 1 | | | | | |
| | 9' h002 | | | | | | | | 1 | 0 | | 8' b00000001 | | | |
| | 9' h003 | | | | | | | | | 1 | | | | | |
| | 9' h1F8 | 1 | 1 | 1 | 1 | 1 | 1 | 0 | 0 | 0 | | 8' b11111100 | | | |
| | 9' h1F9 | | | | | | | | | 1 | | | | | |
| | 9' h1FA | | | | | | | | 1 | 0 | | 8' b11111101 | | | |
| | 9' h1FB | | | | | | | | | 1 | | | | | |
| | 9' h1FC | | | | | | | 1 | 0 | 0 | | 8' b11111110 | | | |
| | 9' h1FD | | | | | | | | | 1 | | | | | |
| | 9' h1FE | | | | | | | | 1 | 0 | | 8' b11111111 | | | |
| | 9' h1FF | | | | | | | | | 1 | | | | | |

FIG. 5

| | WORD SELECT ADDRESS | | | | | | | | | | ROLE | REPAIR INFORMATION IN THE CASE OF REPAIRING WORD | REPAIR INFORMATION IN THE CASE OF NO REPAIR |
|---|---|---|---|---|---|---|---|---|---|---|---|---|---|
| | WORD SELECT ADDRESS IN HEXADECIMAL NOTATION | AD8 | AD7 | AD6 | AD5 | AD4 | AD3 | AD2 | AD1 | AD0 | | | |
| USE ADDRESS SPACE | 9' h000 | 0 | 0 | 0 | 0 | 0 | 0 | 0 | 0 | 0 | NORMAL WORD | 8' b00000000 | 8' b11111111 |
| | 9' h001 | | | | | | | | | 1 | | | |
| | 9' h002 | | | | | | | | 1 | 0 | | 8' b00000001 | |
| | 9' h003 | | | | | | | | | 1 | | | |
| | 9' h13C | | | | | | | 1 | 0 | 0 | | 8' b10011110 | |
| | 9' h13D | | | | | | | | | 1 | | | |
| | 9' h13E | | | | | | | | 1 | 0 | | 8' b10011111 | |
| | 9' h13F | | | | | | | | | 1 | | | |
| UNUSED ADDRESS SPACE | 9' h140 | 1 | 0 | 1 | 0 | 0 | 0 | 0 | 0 | 0 | REDUNDANT WORD A SET | | |
| | 9' h141 | | | | | | | | | 1 | | | |
| | 9' h142 | | | | | | | | 1 | 0 | REDUNDANT WORD B SET | | |
| | 9' h143 | | | | | | | | | 1 | | | |
| | 9' h144 | 1 | 0 | 1 | 0 | 0 | 0 | 1 | 0 | 0 | | | |
| | 9' h145 | | | | | | | | | 1 | | | |
| | 9' h1FC | | | | | | | 1 | 0 | 0 | | | |
| | 9' h1FD | | | | | | | | | 1 | | | |
| | 9' h1FE | | | | | | | | 1 | 0 | | | |
| | 9' h1FF | | | | | | | | | 1 | | | |

DISPLAY CONTROL SEMICONDUCTOR INTEGRATED CIRCUIT

CROSS-REFERENCE TO RELATED APPLICATION

The present application claims priority from Japanese patent application No. 2006-57105 filed on Mar. 3, 2006, the content of which is hereby incorporated by reference into this application.

BACKGROUND OF THE INVENTION

The present invention relates to a display controller having therein a RAM (Random Access Memory) that stores display data and controlling a display device, further, a technique effectively applied to a display controller formed as an integrated semiconductor circuit. For example, the invention relates to a technique effectively used for a liquid crystal control semiconductor integrate circuit for driving a liquid crystal display panel.

In recent years, as a display of a portable electronic device such as a cellular phone or PDA (Personal Digital Assistant), generally, a dot-matrix-type liquid crystal panel in which a plurality of display pixels are two-dimensionally arranged in a matrix is used. In the device, a liquid crystal display controller (liquid crystal controller) formed as a semiconductor integrated circuit and controlling display of the liquid crystal panel and a liquid crystal driver for driving the liquid crystal panel under control of the controller, or a liquid crystal controller/driver having therein a liquid crystal controller and a liquid crystal driver are/is mounted.

Hitherto, in the liquid crystal controller/driver (including the liquid crystal controller), a RAM for storing display data is provided in the chip. The storage capacity of the built-in RAM is generally determined according to the size of the display screen of the liquid crystal panel to be driven and is smaller than that of a general memory. In addition, a so-called redundancy circuit for repairing a defective bit is not provided.

The reason why the storage capacity of the built-in RAM is set to the size of the screen of the liquid crystal panel is as follows. Even if the capacity of the built-in RAM is set to the size of storing display data of one screen of the liquid crystal panel in the liquid crystal controller/driver, the proportion of the RAM in the chip area is relatively large. Consequently, increase in the storage capacity directly causes increase in the chip cost. In the built-in RAM having the capacity of storing display data of one screen, deterioration in the yield due to a defect in the RAM is so significant. It is not so necessary to provide a redundancy circuit, and increase in the chip size by providing a redundancy circuit can be avoided.

The technique of setting the storage capacity of the built-in RAM to the size of storing display data of one screen of a liquid crystal panel is described in, for example, Japanese Unexamined Patent Publication No. 2000-347646.

SUMMARY OF THE INVENTION

The inventors of the present invention tried to increase packing density of a built-in RAM by employing microfabrication process in order to reduce the chip size of a liquid crystal controller/driver and lower the chip cost. However, it was found that when the packing density of a built-in RAM is increased, a defect occurs more easily and a problem of deterioration in the yield due to defects in the RAM arises.

The inventors herein have examined to improve the yield by applying the memory defect repairing technique using a redundancy circuit which is employed in a general RAM. In a redundancy circuit employed in a general RAM, as shown in FIG. 10, a control circuit for selecting a row or column in a normal memory and a control circuit for selecting a row or column in a spare memory, which is replaced with a defective bit are separately provided. Since operation characteristics such as reading speed at the time of accessing a row or column in a normal memory and those at the time of accessing a row or column in a spare memory are different from each other, there is a problem such that designing of timings in peripheral circuits of the memories is difficult.

In addition, the memory defect repairing technique employed in a general RAM requires not only a circuit having a programmable device such as a fuse and storing the address of a row or column in a memory to be repaired (hereinbelow, called a fuse circuit) but also a fuse circuit storing information indicating whether repair is performed or not, that is, whether a row or column in a spare memory is used or not. On the basis of the state of the fuse circuit, a control signal for making a row or column in the spare memory valid or invalid is generated and supplied (a signal with reference characters EN in FIG. 10).

Further, in the case where a plurality of rows or columns in the spare memory are provided in the redundancy circuit of the general RAM, it is necessary to supply a selection signal designating a memory row or column to be used (a signal with reference characters SS in FIG. 10). Consequently, when the memory defect repairing technique of the general RAM is applied directly to the liquid crystal controller/driver, there is a problem such that the occupation area of the redundancy circuit and the wiring becomes large, and it causes disturbance of reduction in the chip size.

An object of the present invention is to repair a defective bit included in a RAM without increasing the occupation area so much in a display control semiconductor integrated circuit such as a liquid crystal controller/driver having therein a RAM that stores display data, thereby enabling the yield to be improved.

Another object of the invention is to facilitate designing of timings of peripheral circuits of a memory so that operation characteristics such as reading speed at the time of accessing a normal memory area and those at the time of accessing a spare memory area are not different from each other in a display control semiconductor integrated-circuit such as a liquid crystal controller/driver having therein a RAM that stores display data.

The above and other objects of the present invention and novel features will become apparent from the description of the specification and the appended drawings.

An outline of representative one of inventions disclosed in the application will be described as follows.

A display control semiconductor integrated circuit in which a RAM for storing display data is provided in a chip and the storage capacity of the built-in RAM is determined according to the size of a display screen of a liquid crystal panel to be driven, includes a fuse circuit for setting a defect address, and a comparing circuit for comparing the defect address set in the fuse circuit with an input address. The circuit also has a redundant circuit, when the addresses match each other, for replacing the input address with an address that instructs the spare memory area and supplying the address to an address decoder.

Generally, the capacity of a RAM provided in a display control semiconductor integrated circuit such as a liquid crystal controller/driver is set to the capacity of storing display data of one screen of a liquid crystal panel. The size of one screen of a liquid crystal panel is determined according to a criterion different from the number of bits of an address or data specifying the size of a general memory and is not the n-th power (n: integer) of 2. In short, in the liquid crystal controller/driver, the use address area of the built-in RAM is smaller than the valid address space specified by the number of bits of the address in the built-in RAM.

In the present invention, by paying attention to the fact, a spare memory area for repair is assigned in an unused address area in the valid address space specified by the number of bits of an address of the built-in RAM. In addition, as a default value of the fuse circuit, an address instructing an area which is in the unused address area in the valid address space and is not assigned as a repair memory area is assigned.

In the case where an address setting register for setting an area for displaying a window in a display screen is provided, the address of a spare storage area is set on the outside of an address range in which an address can be set by the register. Since a window display area can be generally set to the entire display screen at the maximum, the outside of the address range in which an address can be set by the register corresponds to an unused address area in the valid address space. If the liquid crystal controller/driver has a register for setting a valid storage area in the built-in RAM, obviously, the outside of the address range in which the register can set an address can be recognized as the unused address area.

By the above-described means, it is unnecessary to construct, as separate circuits, a control circuit for selecting a normal memory row or column and a control circuit for selecting a spare memory row or column to be replaced with a defective bit, and it facilitates timing design of peripheral circuits of the memory.

In addition, since the default value of the fuse circuit is an address instructing an unused address area which is in the valid address space and is not assigned as a spare memory area, it is unnecessary to generate a control signal for making a spare memory row or column valid or invalid.

Moreover, in the case where the spare memory area is assigned as the unused address area in the valid address space, a defect address and an input address are compared with each other, and a match of the addresses is determined, the input address is replaced with the address instructing the spare memory area, and the resultant address is supplied to the address decoder. Consequently, in the case where a plurality of spare memory rows or columns are provided, it is unnecessary to separately generate and supply a selection signal that designates a memory row or column to be used.

An effect obtained by representative one of the inventions disclosed in the application will be briefly described as follows.

According to the present invention, in a display control semiconductor integrated circuit such as a liquid crystal controller/driver having therein a RAM for storing display data, a defective bit included in the RAM is repaired and the yield can be improved without significantly increasing the occupation area.

BRIEF DESCRIPTION OF THE DRAWINGS

FIG. 4 is a diagram showing the relation between a word select address and repair information in a memory in which a data storage area is set in a whole data storage area and there is no unused address space like a general RAM.

FIG. 5 is a diagram showing the relation between a word select address and repair information in a display memory in the liquid crystal controller/driver of the embodiment.

DETAILED DESCRIPTION OF PREFERRED EMBODIMENTS

Preferred embodiments of the present invention will be described hereinbelow with reference to the drawings.

Figure 1:
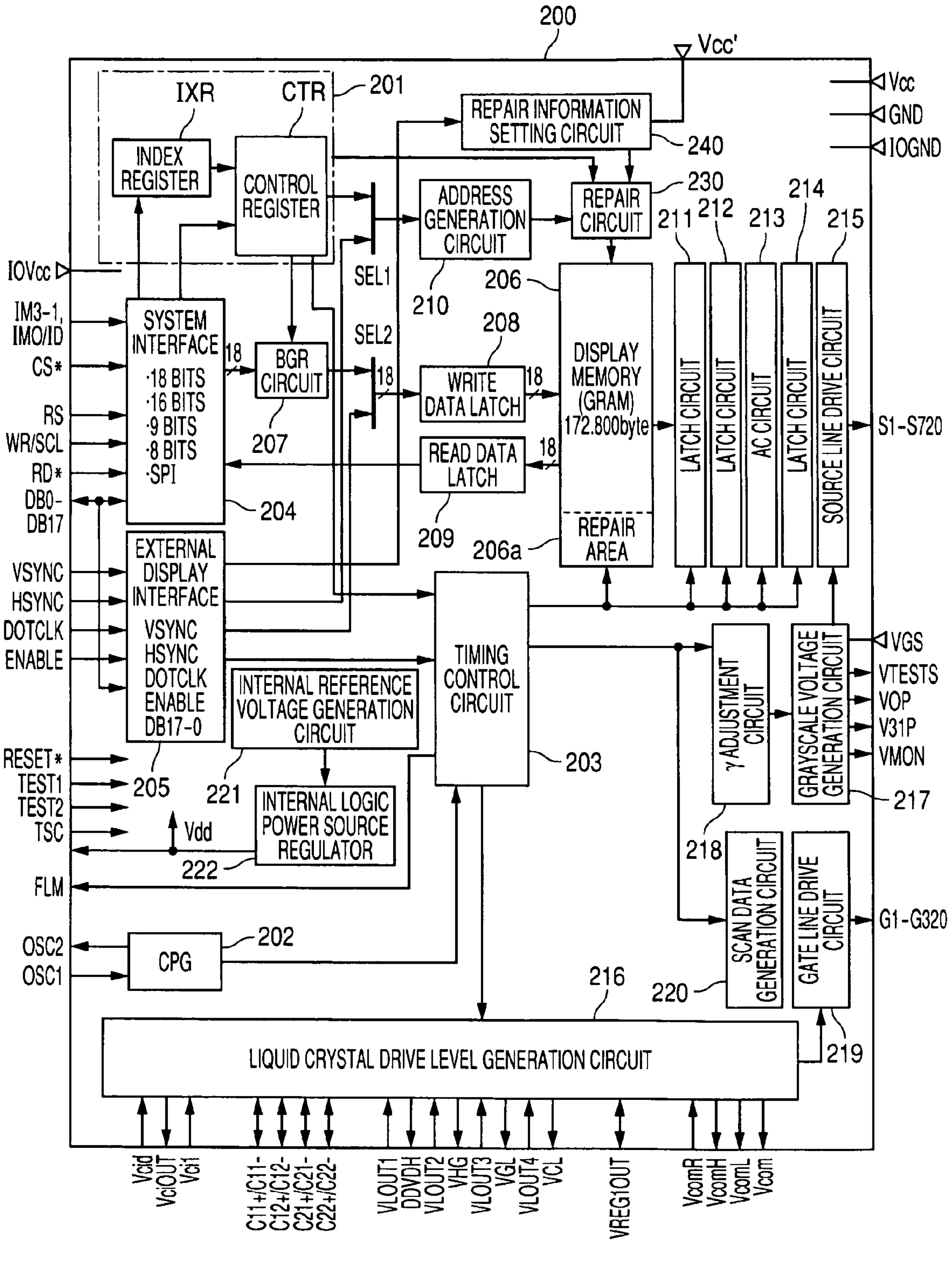
FIG. 1 is a block diagram showing an embodiment of a liquid crystal controller/driver having therein a RAM and a repairing circuit.

FIG. 1 is a block diagram showing an embodiment of a liquid crystal controller/driver 200 having therein a RAM and a repair circuit. The liquid crystal controller/driver 200 has therein a RAM (hereinbelow, called a display memory) as a memory for storing data to be graphic-displayed on a dot-matrix-type liquid crystal display panel. The liquid crystal controller/driver 200 is constructed as a semiconductor integrated circuit on a single semiconductor substrate together with a write circuit, a read circuit, and a driver for outputting a drive signal of a liquid crystal display panel.

The liquid crystal controller/driver 200 of the embodiment has a controller 201 for controlling the whole chip on the basis of instructions from an external microprocessor, microcomputer, or the like. The liquid crystal controller/driver 200 also has a pulse generator 202 for generating a reference clock pulse on the inside of the chip on the basis of an oscillation signal from the outside or an oscillation signal from an oscillator connected to an external terminal, and a timing control circuit 203 for generating a timing signal which gives operation timings to various circuits in the chip on the basis of the clock pulse.

The liquid crystal controller/driver 200 also has a system interface 204 for transmitting/receiving data such as mainly an instruction and stationary display data to/from a microcomputer or the like via a not-shown system bus, and an external display interface 205 for receiving moving picture data and horizontal/vertical sync signals HSYNC and VSYNC mainly from an application processor and the like via a not-shown display data bus.

Further, the liquid crystal controller driver 200 has a display memory 206 for storing display data in a bit map method and a bit converting circuit 207 for performing a bit process such as rearrangement of bits of write data of RGB from the microcomputer. The liquid crystal controller driver 200 has: a write data latch circuit 208 for latching and holding display data converted by the bit converting circuit 207 or display data entered via the external display interface 205; a read data latch circuit 209 for holding display data read from the display memory 206; and an address generating circuit 210 for generating a select address to the display memory 206.

The display memory 206 is constructed by a readable and writable RAM having a memory array including a plurality of memory cells, word lines, and bit lines (data lines), and an address decoder for decoding an address supplied from the address generating circuit 210 and generating a signal for selecting a word line or a bit line in the memory array. The display memory 106 has a sense amplifier for amplifying a signal read from a memory cell, and a write driver for applying a predetermined voltage to a bit line in the memory array in accordance with write data. Although not limited, in the embodiment, the memory array is constructed to have storage capacity of 172,800 bytes and can read/write data on the column (18 bits) unit basis by an address signal of 17 bits.

Further, the liquid crystal controller/driver 200 also has first and second latch circuits 211 and 212 for sequentially latching display data read from the display memory 206, an AC circuit 213 for converting the latched display data to data for performing AC driving which prevents deterioration in the liquid crystal, and a latch circuit 214 for holding the data converted by the AC circuit. The liquid crystal controller/driver 200 also has a liquid crystal drive level generating circuit 216 for generating voltages of a plurality of levels necessary for driving the liquid crystal panel, a gray scale voltage generating circuit 217 for generating a gray scale voltage necessary for generating a waveform signal adapted to color display or gray scale display on the basis of the voltage generated by the liquid crystal drive level generating circuit 216, and a γ adjusting circuit 218 for setting a gray scale voltage for correcting the γ characteristic of the liquid crystal panel.

At the post stage of the latch circuit 214, a source line driving circuit 215 is provided, which selects a voltage according to the display data latched by the latch circuit 214 from the gray scale voltage supplied from the gray scale voltage generating circuit 217 and outputs voltages (source line drive signals) S1 to S720 to be applied to source lines as signal lines of the liquid crystal panel. On the other hand, a gate line drive circuit 219 for outputting voltages (gate line drive signals) G1 to G320 to be applied to gate lines (also called common lines) as selection lines of the liquid crystal panel, a scan data generating circuit 220 made by a shift register for generating scan data for sequentially driving the gate lines of the liquid crystal panel one by one to a selection level, and the like are provided.

Further, an internal reference voltage generating circuit 221 for generating an internal reference voltage and a voltage regulator 222 for generating a power source voltage Vdd of an internal logic circuit such as 1.5V by dropping a voltage Vcc such as 3.3V or 2.5V supplied from the outside are also provided. In FIG. 1, SEL1 and SEL2 denote data selectors which are controlled by a switch signal output from the timing control circuit 203 and selectively pass any of a plurality of input signals.

The controller 201 has registers such as a control register CTR for controlling the operation state of the entire chip such as an operation mode of the liquid crystal controller/driver 200, and an index register IXR for storing index information for referring to the control register CTR and the display memory 206. When an instruction which is executed when an external microcomputer or the like writes data to the index register IXR is designated, the controller 201 generates and outputs a control signal corresponding to the designated instruction.

Under control of the controller 201 constructed as described above, the liquid crystal controller/driver 200 performs a drawing process of sequentially writing display data to the display memory 206 at the time of performing display on a not-shown liquid crystal panel on the basis of an instruction and data from a microcomputer or the like. The liquid crystal controller/driver 200 also performs a reading process of periodically reading display data from the display memory 206, generates and outputs a signal to be applied to the source lines of the liquid crystal panel, and generates and outputs signals sequentially to be applied to the gate lines.

The system interface 204 transmits/receives signals such as setting data and display data to a register required, for example, at the time of drawing an image to the display memory 206 to/from a system controller such as a microcomputer. In the embodiment, the system interface 204 takes the form of an 80-series interface capable of selecting parallel input/output of 18 bits, 16 bits, 9 bits, and 8 bits or serial input/output in accordance with the states of IM3-1 and IM0/ID terminals.

The liquid crystal controller/driver 200 of the embodiment has, in correspondence with the display memory 206, a repair circuit 230 for repairing a defective bit in the display memory 206 and a repair information setting circuit 240 for holding, as repair information, the address of a memory row to be repaired including a defective bit. The display memory 206 has a repair memory area 206*a* provided separately from a normal memory area for storing display data.

Figure 2:
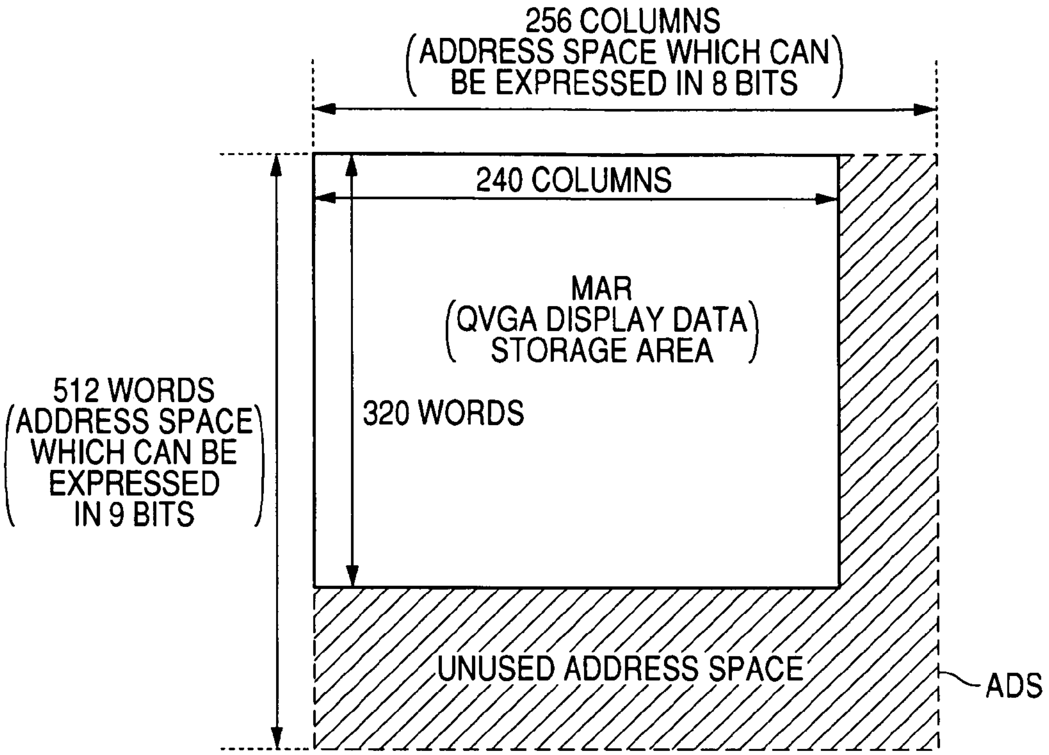
FIG. 2 is a diagram showing the relation between a storage area and an address space in a display memory in the liquid crystal controller/driver of the embodiment.

The relation between the storage area and the address space in the display memory 206 in the liquid crystal controller/driver 200 of the embodiment will be described with reference to FIG. 2. As described above, in the embodiment, data can be read/written on a column (18 bits) unit basis from/to the display memory 206 by a 17-bit address signal. On the other hand, an object to be driven by the liquid crystal controller/driver 200 of the embodiment is a color QVGA liquid crystal panel having 240 pixels in the horizontal direction×320 pixels in the vertical direction. One pixel is constructed by three does of red, blue, and green.

When each dot is expressed by 6-bit data in 64 gray scales, 18-bit data is necessary per pixel. Display data of one screen of the QVGA liquid crystal panel is 240×320×18=3,110,400 bits=172,800 bytes. When 18-bit data is set as one column, as shown in FIG. 2, the size of a storage area MAR of display data of one screen of the QVGA liquid crystal panel corresponds to 320 words×240 columns. In the embodiment, one word does not mean 16 bits but refers to a memory cell group (in the embodiment, 540 bytes) connected to one word line in the memory array.

Therefore, a word address necessary for selecting each of 320 words consists of 9 bits, and a column address necessary for selecting each of 240 columns consists of 8 bits. On the other hand, an address space ADS which can be expressed by a word address of 9 bits and a column address of 8 bits is constructed by 512 words×256 columns. Consequently, in the case of setting the storage capacity of the display memory 206 to a size for storing display data of one screen of the QVGA liquid crystal panel, as shown in FIG. 2, an unused address space exists.

In the liquid crystal controller/driver 200 of the embodiment, the display memory 206 and the repair circuit 230 are constructed so that the area in the word direction in the unused address space is used as the repair memory area 206*a* having spare memory rows. Further, in the embodiment, as a default value of the repair information setting circuit (fuse circuit), an address instructing the unused address area in the address space, which is not assigned as the spare memory area is assigned.

With the configuration, it is unnecessary to construct, as separate circuits, the control circuit for selecting a normal memory row and the control circuit for selecting a spare memory row (hereinbelow, called a redundant word) in the repair memory area 206*a* to be replaced with a defective bit, and it is also unnecessary to generate a control signal for making a redundant word valid or invalid. The reason will be described below with reference to FIGS. 4 and 5.

In the following description, although not limited, four redundant words are provided for the repair memory area 206*a* and can be replaced with a normal memory row in the unit of two words. Replacement in the unit of two words is performed for the reason that, when a defect occurs in a memory array due to adhesion of a foreign matter or the like, the defect often exists in two words, so that the defective words can be replaced efficiently by a small-scale repair circuit.

FIG. 4 shows the relation between a word select address and repair information in the memory in which the data storage area is set in the entire address space and no unused address space is set like in a general RAM. FIG. 5 shows the relation between a word select address and repair information in the display memory in the liquid crystal controller/driver of the embodiment.

In FIGS. 4 and 5, AD8 to AD0 in the column of the word select address indicate bits of a word select address. "9'h" in the word select address column denotes hexadecimal notation of a binary code of 9 bits. "8'b" in the column of a repair address (defective address) denotes binary code notation of 8 bits. The number of bits of the repair address is smaller by one for the purpose of replacement in the unit of two words. In the case of performing replacement in the unit of one word, the repair address consists of 9 bits. "8'bXXXXXXXX" in the second column from the right in FIG. 4 denotes that an arbitrary binary code may be used.

It is understood from FIG. 4 that when the data storage area is set in the entire address space, a repair address used when a defect is included in any of the words has to be set in the fuse circuit, so that there is no room for the repair address. Consequently, a fuse circuit for setting whether a repair address is made valid or invalid is necessary in addition to the fuse circuit for setting a repair address.

On the other hand, in the case where the memory includes an unused address space, as shown in FIG. 5, by assigning redundant words to the unused address space, a redundant word can be selected by the same operation as that for a normal word. In addition, in the case where repair is not performed, since there is an area which is the unused address area in the address space and is not assigned as a spare memory area, an address instructing the area is set in the fuse circuit.

Although the address is in the address space, there is no memory corresponding to the address. Therefore, even if the address is input to the memory, the memory does not operate. It is understood that the fuse circuit for making a redundant word valid or invalid and a control signal (enable signal) are unnecessary. Moreover, by setting the address that is set in the case where repair is not performed to the default value of the fuse circuit and setting the default value to, for example, "8'b11111111" as the initial state, there is an advantage such that in the case where repair is not performed, setting itself of the fuse circuit becomes unnecessary.

Figure 6:
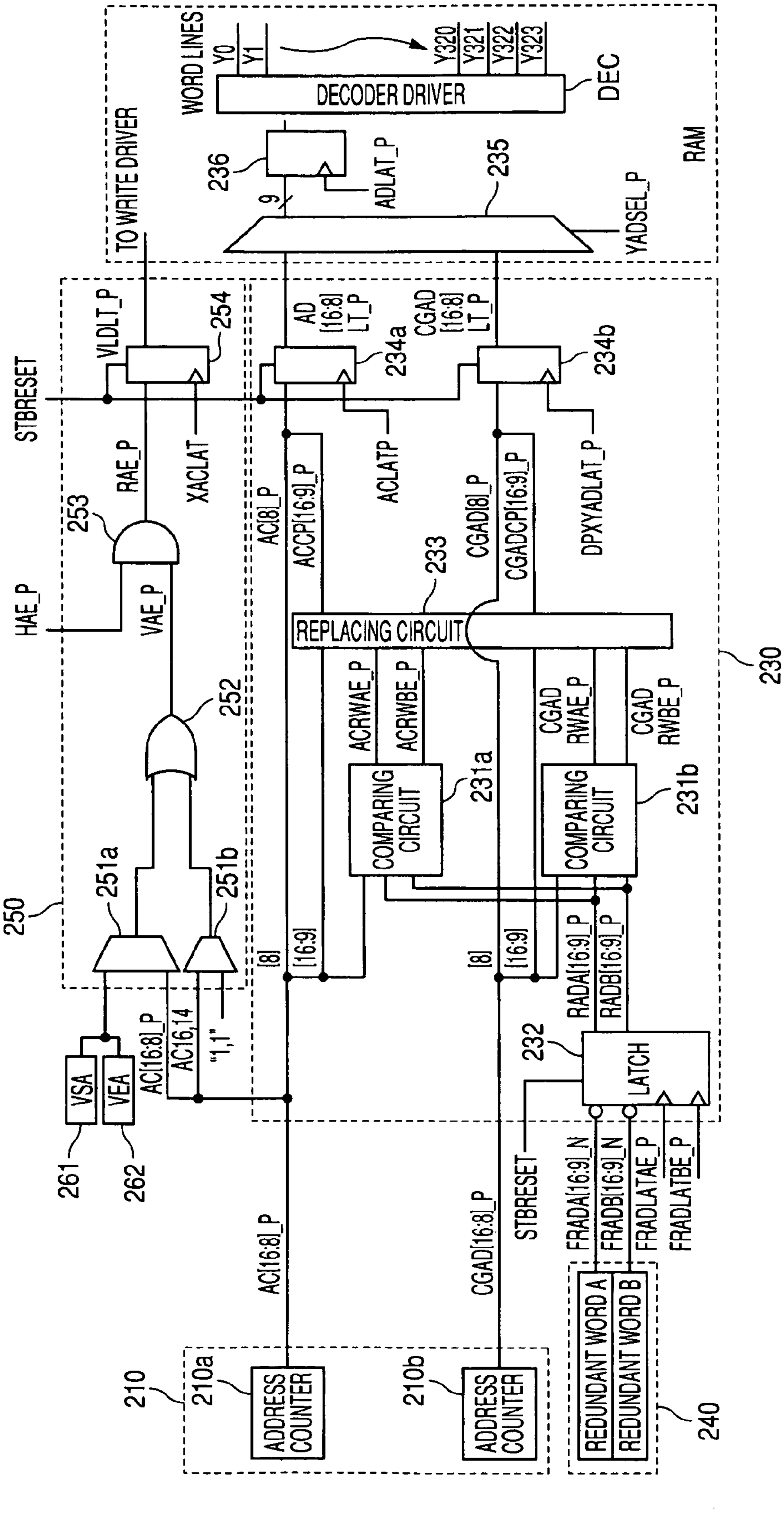
FIG. 6 is a block diagram showing a configuration example of a repair circuit in the liquid crystal controller/driver of the embodiment.
Figure 7:
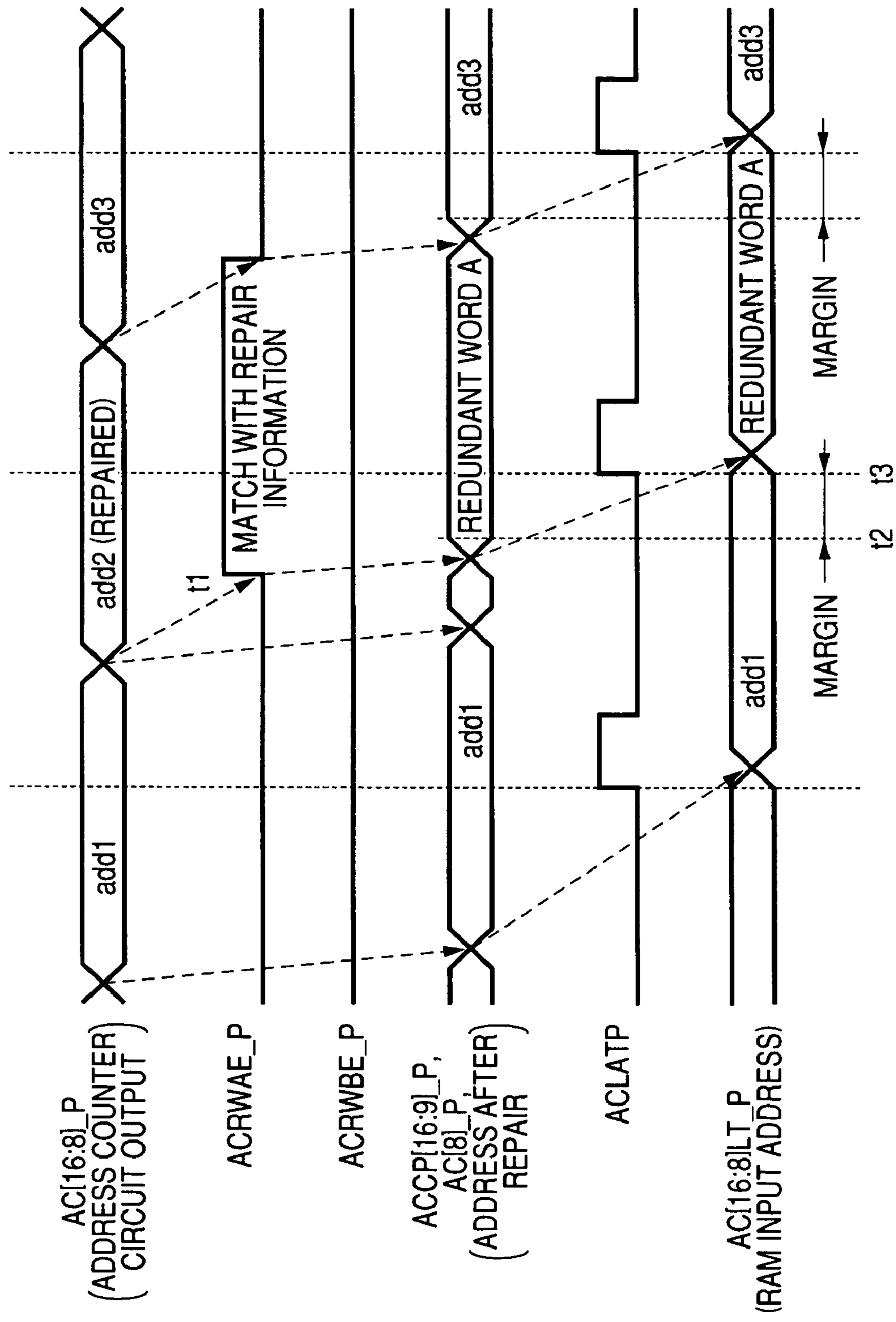
FIG. 7 is a time chart showing operation timings in the repair circuit of the liquid crystal controller driver of the embodiment.

FIG. 6 shows a configuration example of the repair circuit 230. FIG. 7 shows the operation timings of the repair circuit 230.

Although not shown in FIG. 1, the address generating circuit 210 has an address counter 210*a* for generating an address used at the time of reading/writing display data from/to the display memory 206 by a microcomputer and an address counter 210*b* for generating an address used at the time of reading display data from the display memory 206 for displaying display data on the liquid crystal panel. The repair circuit 230 is provided with two comparing circuits 231*a* and 231*b* in correspondence with the two address counters 210*a* and 210*b* to which addresses AC[16-8]P and CGAD[16-8]P generated by the counters are input.

The repair circuit 230 is provided with a latch circuit 232 for latching and holding defective addresses FRADA[16-9]N and FRADB[16-9]N set in the repair information setting circuit 240. The repair information setting circuit 240 is constructed by a device such as a fuse or a nonvolatile memory device which can be programmed after manufacture and, once a setting is made, can hold the setting even after the power source voltage is interrupted. In the embodiment, two upper eight bits in a 9-bit word select address can be set. By setting upper eight bits, replacement on the two-word unit basis is facilitated.

The defective addresses FRADA[16-9]P and FRADB[16-9]P latched and inverted by the latch circuit 232 are supplied to the comparing circuits 231*a* and 231*b* and compared with upper eight bits AC[16-9]P of the address AC[16-8]P and upper eight bits CGAD[16-9]P of the address CGAD[16-8]P generated by the address counters 210*a* and 210*b*, respectively.

After the comparing circuits 231*a* and 231*b*, a replacing circuit 233 is provided. The replacing circuit 233 passes the addresses AC[16-9]P and CGAD[16-9]P as they are when the compared addresses do not match, and outputs a redundant address of upper eight bits for selecting redundant words Y320 and Y321 or Y322 and Y323 in place of the addresses AC[16-9]P and CGAD[16-9]P when the compared addresses match.

A 9-bit address obtained by adding one bit AC[8]P or CGAD[8]P which is not input to the comparing circuit to the 8-bit address output from the replacing circuit 233 is latched by a latch circuit 234*a* or 234*b*. The address latched by the latch circuit 234*a* or 234*b* is selected by a selector 235 at the post stage and latched by a latch circuit 236. After that, the address is supplied to a decoder driver DEC in the display memory 206 and is decoded. As a result, one word line corresponding to the decoded address is selected from word lines Y0 to Y323 in the display memory 206.

In the liquid crystal controller/driver 200 of the embodiment, when a defective bit is found in the display memory 206 by a probe test or the like conducted in the final step of the process, the address of a memory row including the defective bit is set as a defective address in the repair information setting circuit 240. When the liquid crystal controller/driver 200 is mounted in a system and the power is turned on, a defective address is read from the repair information setting circuit 240, latched by the latch circuit 232 in the repair circuit 230, and held until the power is turned off. When the repair information setting circuit 240 is a circuit of the type capable of continuously outputting the address during turn-on of the power, it is unnecessary to provide the latch circuit 232.

In the repair information setting circuit 240, the state in which no defective address is set is "00000000", so that the default value obtained by being inverted in the latch circuit 232 and output is set as "8'b11111111". When the initial state in which no defective address is set in the repair information setting circuit 240 is "11111111", the address can be supplied as it is as the default value "8'b11111111" to the comparing circuit without being inverted in the latch circuit 232. In the repair information setting circuit 240 of the embodiment, information indicating whether repair is performed or not is not set. Therefore, a control signal for making a normal word or spare word (redundant word) valid or invalid on the basis of such information is also unnecessary.

Figure 10:
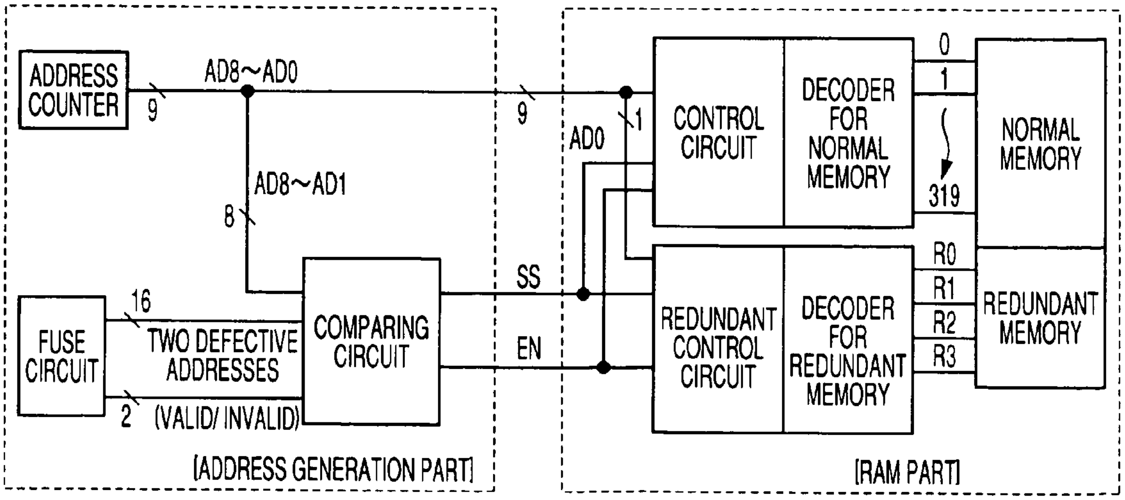
FIG. 10 is a block diagram showing the configuration of a redundancy circuit employed in a general RAM.

As obviously understood by comparison between FIG. 6 and FIG. 10 showing the conventional redundant circuit, in FIG. 10, the control circuit and the decoder for selecting a normal memory row or column are provided separately from the control circuit and the decoder for selecting a spare memory row or column (redundant memory) to be replaced with a defective bit. Consequently, the operation characteristics such as read speed at the time of accessing a normal memory row or column and those at the time of accessing a spare memory row or column are different from each other, so that timing designing of peripheral circuits of the memory is difficult. On the other hand, in the redundant circuit of FIG. 6, a common decoder driver is used as a decoder driver for selecting a normal word and a decoder driver for selecting a redundant word. Therefore, the operation characteristics such as read speed at the time of selecting a normal word and those at the time of selecting a spare word are the same, and timing designing of peripheral circuits of the memory is facilitated.

FIG. 7 show the operation timings of the repair circuit 230. Since the operation of the repair circuit 230 in response to an address from the address counter 210*a* for generating a write address and that of the repair circuit 230 in response to an address from the address counter 210*b* for generating a read address are the same, only the operation timings of the repair circuit 230 in response to an address from the address counter 210*a* are shown.

As shown in FIG. 7, when the address AC[16-8]P from the address counter 210*a* matches a defective address A out of two defective addresses A and B set in the repair information setting circuit 240, an output of the comparing circuit 231*a* changes to the high level (timing t1). Accordingly, the address output from the replacing circuit 233 becomes an address for selecting a redundant word A (timing t2).

Consequently, the address of the redundant word A is latched by a latch circuit 234 at the post stage synchronously with the riding edge of a latch timing signal ACLATP (timing t3). It is understood from FIG. 7 that, in the embodiment, by designing a circuit so as to provide a predetermined margin between the timing t2 at which the address switches to the redundant word A in the replacing circuit 233 and the timing t3 of the rising edge of the latch timing signal ACLATP, an erroneous operation can be prevented. Thus, timing designing is facilitated.

Figure 3:
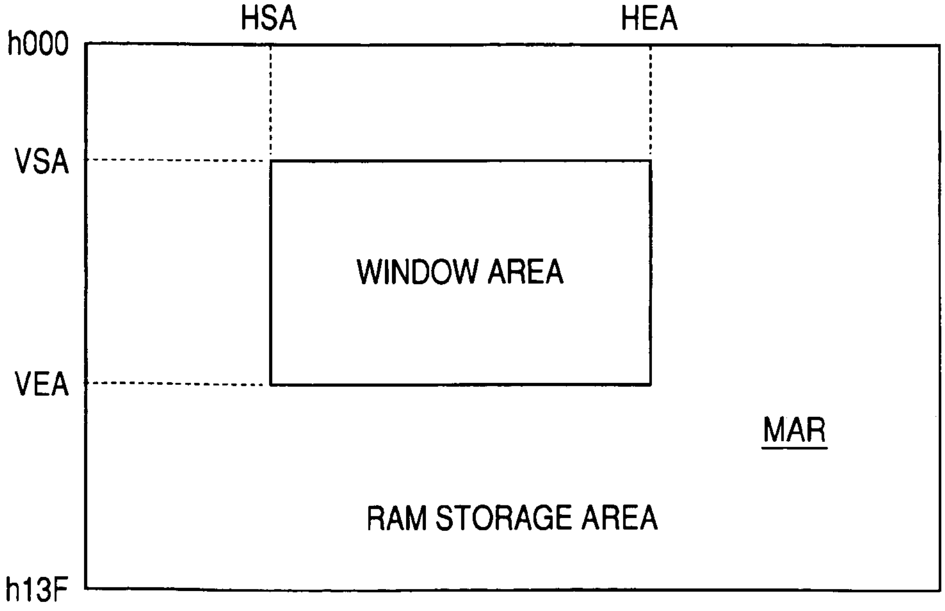
FIG. 3 is a diagram showing the relation between a display screen and a window area in the case of performing window display and a window area.

In FIG. 6, a circuit 250 for performing a write inhibition control in conjunction with the operation of the repair circuit 230 is also shown. The write inhibit control circuit is originally provided to inhibit writing of data to an area other than a window in the case of displaying a window as shown in FIG. 3 in a part of the display screen of the liquid crystal panel. The write inhibit control circuit 250 shown in FIG. 6 is shown conceptually and the invention is not limited to such a configuration.

261 denotes a register for setting a window start address (VSA, HAS) and 262 denotes a register for setting a window end address (VEA, HEA). By the registers 261 and 262, the entire display screen, that is, the entire storage area of the display memory 206 can be designated at the maximum. The window setting registers 261 and 262 are provided as a part of the control register CTR in FIG. 1 or registers separate from the control register CTR in the controller 201.

The write inhibit control circuit 250 is provided with a comparing circuit 251*a* for comparing the addresses VSA and VEA set in the window setting registers 261 and 262 with the address AC[16-8]P from the address counter 210*a*. The comparing circuit 251*a* determines whether a write address lies in the window display area or not. When the write address lies in the window display area, an output of the comparing circuit 251*a* becomes the high level. When the write address lies out of the window display area, an output becomes the low level.

The write inhibit control circuit 250 is also provided with a comparing circuit 251*b* for detecting whether the most significant bit AC16 and upper three bits AC14 in the address AC[16-8]P are "1, 1" or not. The comparing circuit 251*b* determines whether the write address is in the unused address space or not. It is understood from FIG. 5 that, in the display memory of the embodiment, the address area in which AC16 and AC14 are "1, 1" is the unused address space. When the write address is out of the unused address space, an output of the comparing circuit 251*b* is at the high level. When the write address is in the unused address space, an output of the comparing circuit 251*b* is at the low level.

Although not limited, outputs of the comparing circuits 251*a* and 251*b* are input to an OR gate 252, and an output signal VAE_Pt of the OR gate 252 is supplied to a write driver (not shown) in the display memory 206 via an AND gate 253 and a latch circuit 254 so that the writing operation is not performed when the output signal VAE_P changes to the low level. A signal HAE_P input to the other terminal of the AND gate 253 is a signal from a write inhibit control circuit (not shown) having a similar configuration provided on the column side.

Figure 8:
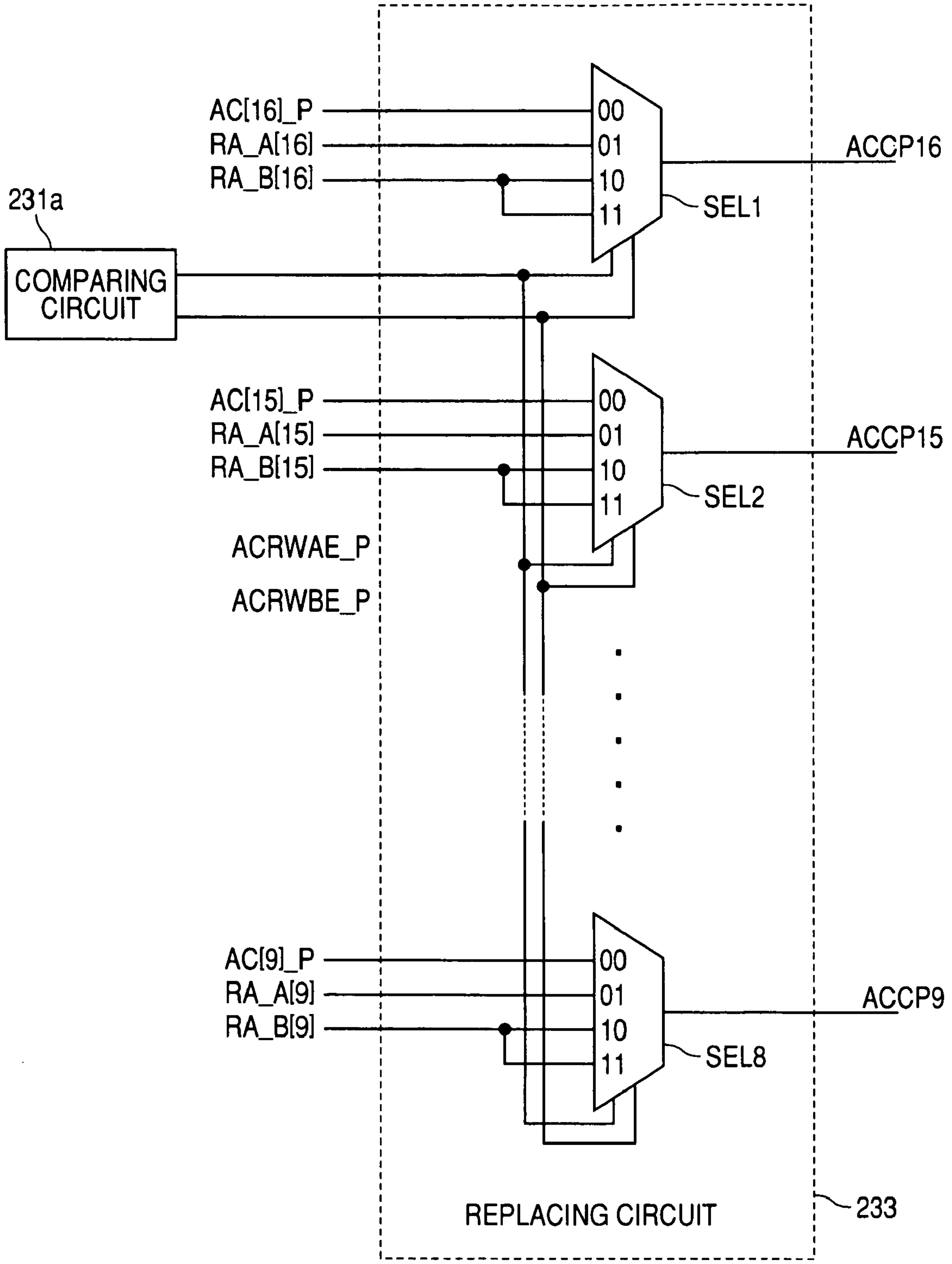
FIG. 8 is a block diagram showing a configuration example of a replacing circuit in the repair circuit of the embodiment.

FIG. 8 shows a configuration example of the replacing circuit 233. There are a replacing circuit 233 corresponding to the address counter 210*a* and the comparing circuit 231*a* and a replacing circuit 233 corresponding to the address counter 210*b* and the comparing circuit 231*b*. As the replacing circuits 233 have the same configuration, only one of them is shown and the other one is not shown.

The replacing circuit 233 of FIG. 8 is constructed by selectors SEL1 to SEL8. To each of the selectors, bits of the address AC[16-9]P from the address counter 210*a* and bits of two redundant addresses RA_A[16-9] and RA_B[16-9] are input. According to address match signals ACRWAE_P and ACRWBE_P from the comparing circuit 231*a*, one of the input addresses is selected by the selectors SEL1 to SEL8 and output as ACCP[16-9].

To be concrete, when the address match signal ACRWAE_P is changed to the high level indicative of a match, the redundant address RA_A[16-9] is selected and output. When the address match signal ACRWBE_P is changed to the high level indicative of a match, the redundant address RA_B[16-9] is selected and output. When both of ACRWAE_P and ACRWBE_P are set to the low level indicative of a mismatch, the address AC[16-9]P from the address counter 210*a* is selected and output. When the address match signal ACRWBE_P is set to the high level indicative of a match, the redundant address RA_B[16-9] is selected and output. When both of ACRWAE_P and ACRWBE_P are set to the low level indicative of a mismatch, the address AC[16-9]P from the address counter 210*a* is selected and output.

The bits of the redundant addresses RA_A[16-9] and RA_B[16-9] can be generated by, for example, an inverter whose input is pulled up to the power source voltage Vcc or an inverter whose input is pulled down to the ground voltage GND. Alternatively, depending on the circuit type of the selectors SEL1 to SEL8, the input terminal may be directly connected to the voltage Vcc or GND. Since the redundant address is fixed from the beginning, it is unnecessary to construct a programmable circuit like the repair information setting circuit 240.

Further, in the repair circuit using the replacing circuit of the embodiment, when a defective address is not set in the repair information setting circuit 240, the address match signals ACRWAE_P and ACRWBE_P are not set to the high level, so that the address replacement is not performed.

Figure 9:
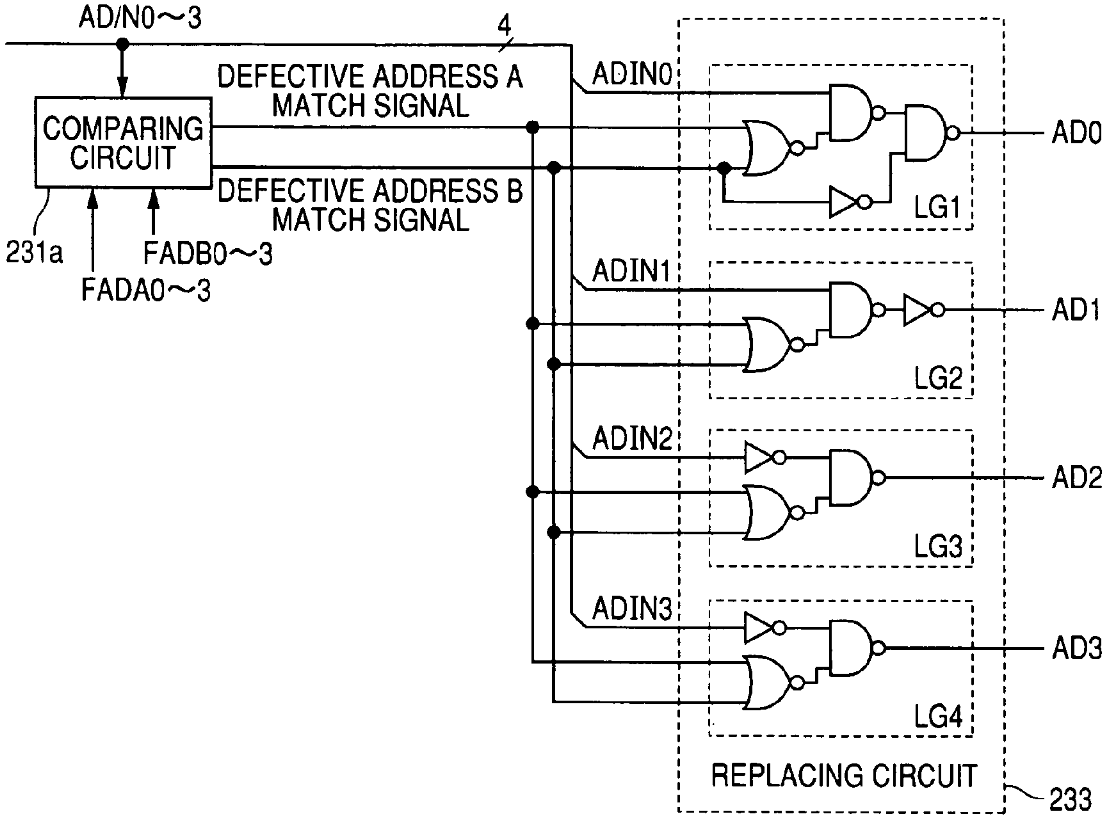
FIG. 9 is a block diagram showing another configuration example of the replacing circuit in the embodiment.

FIG. 9 shows another configuration example of the replacing circuit 233. There are a replacing circuit 233 corresponding to the address counter 210*a* and the comparing circuit 231*a* and a replacing circuit 233 corresponding to the address counter 210*b* and the comparing circuit 231*b*. As the replacing circuits 233 have the same configuration, only one of them is shown and the other one is not shown.

The replacing circuit 233 of FIG. 9 is constructed by a combinational logic circuit made by a plurality of logic gates. In the repair circuit of FIG. 6, the case where the address to be compared by the comparing circuit 231*a* consists of eight bits is shown. If the replacing circuit 233 constructed by a combinational logic circuit corresponding to the case is shown, the diagram is complicated. For easier understanding, FIG. 9 shows the replacing circuit 233 in the case where the address consists of four bits. In the following description using FIG. 9, defective addresses FADA3 to FADA0 and FADB3 to FADB0 set in the repair information setting circuit 240 are set as "0001" and "1010", and redundant addresses are set as "1100" and "1101".

When addresses ADIN3 to ADIN0 supplied from the address counter 210*a* to the comparing circuit 231*a* match the defective addresses FADA3 to FADA0, a defective address A match signal ACRWAE_P is set to "1". When addresses ADIN3 to ADIN0 match the defective addresses FADB3 to FADB0, a defective address B match signal ACRWBE_P is set to "1". When the signals ADIN3 to ADIN0, ACRWAE_P, and ACRWBE_P are input to the replacing circuit 233 constructed by the combinational logic circuit and both ACRWAE_P and ACRWBE_P are "0", as shown in Table 1, ADIN3 to ADIN0 are output as AD3 to AD0.

When ACRWAE_P is "1", the redundant address "1100" is output as AD3 to AD0. When ACRWBE_P is "1", the redundant address "1101" is output as AD3 to AD0. That is, the logics of the logic gate circuits LG1 to LG4 of the replacing circuit 233 are set so as to satisfy the truth table of Table 1. The logic gate circuits LG1 to LG4 shown in FIG. 9 are an example, and any circuits may be used as long as they have a similar logic.

TABLE 1

| Input signal | | | | | | Output signal | | | |
|---|---|---|---|---|---|---|---|---|---|
| ADIN3 | ADIN2 | ADIN1 | ADIN0 | Defective address A match signal | Defective address B match signal | AD3 | AD2 | AD1 | AD0 |
| 0 | 0 | 0 | 0 | 0 | 0 | 0 | 0 | 0 | 0 |
| 0 | 0 | 0 | 1 | 1 | 0 | 1 | 1 | 0 | 0 |
| 1 | 0 | 1 | 0 | 0 | 1 | 1 | 1 | 0 | 1 |

It is understood from Table 1, for a bit which is output as "1" when any of the defective address match signals ACRWAE_P and ACRWBE_P is "1", the logic gate circuit LG3 (LG4) is used. For a bit which is output as "0" when any of the defective address match signals ACRWAE_P and ACRWBE_P is "1", the logic gate circuit LG2 is used. For a bit which is output as "0" when the defective address match signal ACRWAE_P is "1" and ACRWBE_P is "0", and is output as "1" when the defective address match signal ACRWAE_P is "0" and ACRWBE_P is "1", the logic gate circuit LG1 is used.

On the contrary, for a bit which is output as "0" when the defective address match signal ACRWAE_P is "0" and ACRWBE_P is "1", and is output as "1" when the defective address match signal ACRWAE_P is "1" and ACRWBE_P is "0", it is sufficient to use a gate in which the inverter in the logic gate circuit LG1 in FIG. 9 receives ACRWAE_P, not ACRWBE_P. By using the replacing circuit 233 constructed by the combinational logic circuit as shown in FIG. 9, it becomes unnecessary to provide a circuit for generating the redundant addresses RA_A[16-9] and RA_B[16-9].

Although the present invention achieved by the inventors herein has been concretely described above, obviously, the invention is not limited to the foregoing embodiments but can be variously modified without departing from the gist.

For example, although a spare memory area is provided as a redundant word for performing word repair in the foregoing embodiment, a spare memory area may be provided as a redundant column for performing column repair. Although repair is performed by replacement in the unit of two words in the embodiment, repair may be performed by replacement in the unit of one word or three or more words.

The present invention can be also applied to a liquid crystal controller/driver capable of generating and outputting drive signals for two or more liquid crystal panels, having a display memory storing display data of two screens or a display memory having a storage area larger than a storage area of display data of one screen for overlapping display.

The case of applying the present invention achieved by the inventors herein to the liquid crystal controller driver for generating and outputting a drive signal for a QVGA liquid crystal panel in the field of utilization as the background of the invention has been described above. The invention is not limited to the case but can be applied not only to a liquid crystal controller/driver for generating and outputting a drive signal for a liquid crystal panel other than the QVGA liquid crystal panel but also to a display control semiconductor integrated circuit for driving a display device other than a liquid crystal such as an organic EL display panel.

What is claimed is:

1. A display control semiconductor integrated circuit comprising:

a readable/writable display memory having a storage area smaller than an address space of the n-th power of 2, which can be expressed by an address made by a binary code of n bits (where n is an integer), and storing display data in the storage area, wherein the display memory has a spare storage area in addition to a normal storage area for storing display data;

a repair circuit for performing defect repair by replacing an area including a defect in the display memory with the spare storage area is provided;

an address setting register for setting an area for displaying a window in a display screen;

repair information setting means for setting address information of an area including a defect in the display memory;

an address comparing circuit for comparing an address set in the repair information setting means with an input address supplied to the display memory;

an address replacing circuit;

a first address counter for generating an address for writing data to the display memory;

a second address counter for generating an address for reading data from the display memory;

a first address comparing circuit for comparing an address generated by the first address counter with an address set in the repair information setting means; and a second address comparing circuit for comparing an address generated by the second address counter with the address set in the repair information setting means, wherein the address replacing circuit is configured to replace an address when a match of addresses is detected by the first or second address comparing circuit, wherein, when the address comparing circuit detects a match of the addresses, the address replacing circuit is configured to replace the input address supplied to the display memory with an address designating the spare storage area, wherein, when address information of the area including a defect in the display memory is not set, the repair information setting means indicated an address out of the address range of the normal storage area and the spare storage area in the address space, wherein the address of the spare storage area is set on the outside of an address range in which and address can be set by the register, wherein an address of the spare storage area is set in the address space and on the outside of a range of addresses of the normal storage area, and wherein the repair information setting means does not include means for setting information indication whether an area including a defect in the display memory id replaced with the spare memory area or not.

2. The display control semiconductor integrated circuit according to claim 1, wherein the display memory has an address decoder, and the address decoder selects the normal storage area and the spare storage area on the basis of a common input address.

3. The display control semiconductor integrated circuit according to claim 1, wherein the address replacing circuit is a combinational logic circuit comprising a plurality of logic gate circuits configured to receive an address input to the address comparing circuit and an output of the address comparing circuit, and to output an address that designates the spare storage area by a logic operation.

4. The display control semiconductor integrated circuit according to claim 1, wherein replacement of an area including a defect in the display memory with the spare storage area by the repairing circuit is performed in the unit of a word as the storage area in the display memory corresponding to one display line in a display device.

5. The display control semiconductor integrated circuit according to claim 1, further comprising:

a write inhibit control circuit including a third address comparing circuit for detecting whether an address generated by the first address counter lies in an address range of the normal storage area or not and, when the third address comparing circuit determines that an address generated by the first address counter does not lie in the address range of the normal storage area, the write inhibit control circuit is configured to generate and output a signal inhibiting writing of data to the display memory.

6. The display control semiconductor integrated circuit according to claim 5, wherein the display memory has an address decoder, and the address decoder selects the normal storage area and the spare storage area on the basis of a common input address.

7. The display control semiconductor integrated circuit according to claim 5, wherein the address replacing circuit is a combinational logic circuit comprising a plurality of logic gate circuits configured to receive an address input to the address comparing circuit and an output of the address comparing circuit, and to output an address that designates the spare storage area by a logic operation.

8. The display control semiconductor integrated circuit according to claim 5, wherein replacement of an area including a defect in the display memory with the spare storage area by the repairing circuit is performed in the unit of a word as the storage area in the display memory corresponding to one display line in a display device.

* * * * *